US009287526B2

(12) United States Patent
Miyazawa et al.

(10) Patent No.: US 9,287,526 B2
(45) Date of Patent: Mar. 15, 2016

(54) ORGANIC EL DISPLAY DEVICE

(71) Applicant: Japan Display Inc., Tokyo (JP)

(72) Inventors: Toshio Miyazawa, Tokyo (JP);
Mitsuhide Miyamoto, Tokyo (JP);
Hironori Toyoda, Tokyo (JP); Kouhei Takahashi, Tokyo (JP); Masumi Nishimura, Tokyo (JP)

(73) Assignee: Japan Display Inc., Tokyo (JP)

( * ) Notice: Subject to any disclaimer, the term of this patent is extended or adjusted under 35 U.S.C. 154(b) by 0 days.

(21) Appl. No.: 14/501,094

(22) Filed: Sep. 30, 2014

(65) Prior Publication Data

US 2015/0090992 A1 Apr. 2, 2015

(30) Foreign Application Priority Data

Oct. 1, 2013 (JP) .................................. 2013-206760

(51) Int. Cl.
*H01L 51/52* (2006.01)

(52) U.S. Cl.
CPC ..... *H01L 51/5271* (2013.01); *H01L 2251/5315* (2013.01)

(58) Field of Classification Search
CPC .................................................. H01L 51/5271
USPC .................................................. 257/E51.021
See application file for complete search history.

(56) References Cited

U.S. PATENT DOCUMENTS

| | | | |
|---|---|---|---|
| 6,433,487 B1 * | 8/2002 | Yamazaki .................. 315/169.3 |
| 6,757,037 B2 * | 6/2004 | Matsuo et al. ................ 349/113 |
| 6,956,245 B2 * | 10/2005 | Senda et al. ..................... 257/94 |
| 7,042,150 B2 * | 5/2006 | Yasuda ......................... 313/498 |
| 7,183,586 B2 * | 2/2007 | Ichihara et al. ................. 257/98 |
| 7,223,146 B2 * | 5/2007 | Nishikawa ....................... 445/23 |
| 7,572,037 B2 * | 8/2009 | Fukuda et al. ................ 362/347 |
| 7,903,055 B2 * | 3/2011 | Nishikawa et al. ............. 345/77 |
| 8,076,686 B2 * | 12/2011 | Yu et al. .......................... 257/98 |
| 8,263,989 B2 * | 9/2012 | Cheong ............................ 257/97 |
| 8,288,788 B2 * | 10/2012 | Moteki et al. .................... 257/98 |
| 8,368,617 B2 * | 2/2013 | Asaki et al. ..................... 345/76 |
| 8,373,188 B2 * | 2/2013 | Suh et al. ......................... 257/98 |
| 8,525,201 B2 * | 9/2013 | Lee et al. ......................... 257/98 |
| 8,536,602 B2 * | 9/2013 | Kim et al. ........................ 257/98 |
| 8,546,178 B2 * | 10/2013 | Morioka et al. ................ 438/96 |
| 8,563,997 B2 * | 10/2013 | Cheong ............................ 257/97 |
| 8,618,564 B2 * | 12/2013 | Chu et al. ......................... 257/98 |
| 8,653,502 B2 * | 2/2014 | Yahata et al. .................... 257/13 |
| 8,703,512 B2 * | 4/2014 | Lee et al. ......................... 438/29 |
| 8,728,841 B2 * | 5/2014 | Oh et al. ......................... 438/46 |

(Continued)

FOREIGN PATENT DOCUMENTS

| | | |
|---|---|---|
| JP | 2008-234933 A | 10/2008 |
| JP | 2011-228229 A | 11/2011 |

*Primary Examiner* — Earl Taylor
(74) *Attorney, Agent, or Firm* — Typha IP LLC

(57) ABSTRACT

In an organic EL display device having plural organic EL elements each including an organic light emitting layer, an upper electrode formed on an upper side of the organic light emitting layer, and a reflective layer formed on a lower side of the organic light emitting layer, in which an image is displayed on a side of the organic light emitting layer on which the upper electrode is formed. The reflective layer in each of the organic EL elements includes a first plane, a second plane formed on a side lower than the first plane; and an inclined plane formed between the first plane and the second plane, and linearly inclined at a given angle equal to or higher than 35°, and equal to or lower than 55°.

11 Claims, 8 Drawing Sheets

(56) References Cited

U.S. PATENT DOCUMENTS

| | | | |
|---|---|---|---|
| 8,729,580 B2 * | 5/2014 | Lester | 257/98 |
| 8,785,308 B2 * | 7/2014 | Uenishi | 438/551 |
| 8,829,495 B2 * | 9/2014 | Kim et al. | 257/40 |
| 8,829,786 B2 * | 9/2014 | Sumida et al. | 313/504 |
| 8,941,136 B2 * | 1/2015 | Kamiyama et al. | 257/98 |
| 8,946,748 B2 * | 2/2015 | Kim et al. | 257/98 |
| 8,963,183 B2 * | 2/2015 | Suh et al. | 257/98 |
| 8,981,409 B2 * | 3/2015 | Kazama | 257/98 |
| 9,024,342 B2 * | 5/2015 | Kamiya et al. | 257/98 |
| 9,029,844 B2 * | 5/2015 | Choi et al. | 257/40 |
| 9,062,852 B2 * | 6/2015 | Kim et al. | |
| 2003/0057444 A1 * | 3/2003 | Niki et al. | 257/200 |
| 2004/0017153 A1 * | 1/2004 | Nishikawa | 313/506 |
| 2005/0001227 A1 * | 1/2005 | Niki et al. | 257/98 |
| 2005/0104080 A1 * | 5/2005 | Ichihara et al. | 257/98 |
| 2008/0024402 A1 * | 1/2008 | Nishikawa et al. | 345/82 |
| 2008/0121903 A1 * | 5/2008 | Hiramatsu et al. | 257/89 |
| 2008/0143649 A1 * | 6/2008 | Asaki et al. | 345/76 |
| 2008/0219005 A1 * | 9/2008 | Fukuda et al. | 362/284 |
| 2008/0303043 A1 * | 12/2008 | Niki et al. | 257/98 |
| 2009/0042328 A1 * | 2/2009 | Niki et al. | 438/46 |
| 2009/0224272 A1 * | 9/2009 | Yu et al. | 257/98 |
| 2010/0163901 A1 * | 7/2010 | Fudeta | 257/98 |
| 2010/0264445 A1 * | 10/2010 | Niki et al. | 257/98 |
| 2010/0264446 A1 * | 10/2010 | Niki et al. | 257/98 |
| 2010/0264447 A1 * | 10/2010 | Niki et al. | 257/98 |
| 2010/0266815 A1 * | 10/2010 | Niki et al. | 428/156 |
| 2010/0267181 A1 * | 10/2010 | Niki et al. | 438/46 |
| 2010/0295075 A1 * | 11/2010 | Smith et al. | 257/98 |
| 2011/0140151 A1 * | 6/2011 | Lee et al. | 257/98 |
| 2012/0009768 A1 * | 1/2012 | Tadatomo et al. | 438/479 |
| 2012/0068596 A1 * | 3/2012 | Inoue et al. | 313/504 |
| 2012/0080698 A1 * | 4/2012 | Chu et al. | 257/98 |
| 2012/0080710 A1 * | 4/2012 | Inoue et al. | 257/98 |
| 2012/0228656 A1 * | 9/2012 | Kamiyama et al. | 257/98 |
| 2012/0248406 A1 * | 10/2012 | Yahata et al. | 257/13 |
| 2012/0299040 A1 * | 11/2012 | Kim et al. | 257/98 |
| 2012/0305974 A1 * | 12/2012 | Cheong | 257/98 |
| 2013/0032779 A1 * | 2/2013 | Huang et al. | 257/13 |
| 2013/0146925 A1 * | 6/2013 | Suh et al. | 257/98 |
| 2013/0175568 A1 * | 7/2013 | Uenishi | 257/98 |
| 2013/0228808 A1 * | 9/2013 | Lester | 257/98 |
| 2014/0117397 A1 * | 5/2014 | Saeki et al. | 257/98 |
| 2014/0124751 A1 * | 5/2014 | Choi et al. | 257/40 |
| 2015/0090992 A1 * | 4/2015 | Miyazawa et al. | 257/40 |

* cited by examiner

ORGANIC EL DISPLAY DEVICE

CROSS-REFERENCE TO RELATED APPLICATION

The present application claims priority from Japanese application JP2013-206760 filed on Oct. 1, 2013, the content of which is hereby incorporated by reference into this application.

BACKGROUND OF THE INVENTION

1. Field of the Invention

The present invention relates to an organic EL display device.

2. Description of the Related Art

An organic electroluminescent (EL) display device has plural organic EL elements on a substrate.

Each of the organic EL elements includes an organic light emitting layer having plural functional material layers, and an upper electrode (cathode) and a lower electrode (anode) that holds the organic light emitting layer therebetween. In the organic EL display device of the top emission type which outputs an image to an upper electrode side, a reflective layer that reflects the light emitted toward a lower electrode side from the organic light emitting layer is arranged.

JP 2008-234933 A discloses an organic EL display device in which a reflective layer having a scattering property is arranged between a substrate and a first electrode to improve light extraction efficiency. Also, JP2011-228229A discloses an organic EL display device in which a reflective layer formed on a side opposite to an observation surface is concaved to improve the light extraction efficiency, thereby enabling higher definition.

SUMMARY OF THE INVENTION

The light emission in the organic EL display device of the top emission type is emitted to an observer side by repeating refraction and reflection by a layer structure extending from a reflective layer to an outside through an organic light emitting layer. However, the light totally reflected by an interface of layers different in refractive index is likely to remain in the interior of the layer structure, and causes the light extraction efficiency of the organic EL display device to be deteriorated.

FIG. 8 is a diagram illustrating an example of a path of light emitted to the observer side in the organic EL display device, and a path of light that repeats total reflection within the organic EL display device. In FIG. 8, an upper electrode and a protective film (silicon nitride: SiN) that cover an organic light emitting layer OL from an upper side accept a high refractive index layer HI having a refractive index 1.85, and a resin filler layer and a sealing substrate that cover an upper side of them accept a low refractive index layer LI having the refractive index 1.50.

A light beam a in FIG. 8 represents a path of light that is emitted from the organic light emitting layer OL, and travels to an external of the organic EL display device. The light is emitted to an air layer A1 after the light has been refracted on an interface of the high refractive index layer HI or the low refractive index layer LI. Also, a light beam b represents a path of light that enters the interface of the air layer A1 at an angle of 41.8° or higher, and is totally reflected. A light beam c represents a path of light that enters the interface between the high refractive index layer HI and the air layer A1 at an angle of 52.4° or higher, and is totally reflected.

Specifically, when an emission angle $\theta a$ from the organic light emitting layer OL is $0° \leq \theta a < 32.7°$, the light becomes the light beam "a" that is emitted to the external of the organic EL display device (the emission angle $\theta b$ to the interface of the air layer A1 is $0° \leq \theta b < 41.8°$). Also, when an emission angle $\theta a$ from the organic light emitting layer OL is $32.7° \leq a < 54.2°$, the light becomes the light beam "b" that is totally reflected by the interface of the air layer A1 ($41.8° \leq \theta b'$). Further, when an emission angle $\theta a$ from the organic light emitting layer OL is equal to or higher than 54.2°, the light becomes the light beam c that is totally reflected by the interface of the low refractive index layer LI ($54.2° \leq \theta a'$). Therefore, the light beam b and the light beam c whose emission angle $\theta a$ from the organic light emitting layer OL is equal to or higher than 32.7° hardly contribute to an improvement in the light extraction efficiency.

In order to reduce a loss of light caused by total reflection generated within the organic EL display device as described above, as disclosed in JP 2008-234933 A, it is conceivable that a reflective layer having the scattering property is formed on a lower side of the organic light emitting layer OL, and a propagation path of the light is changed to facilitate light emission to the external. However, in this case, viewing angle characteristics are improved, but an improvement in the light extraction efficiency is not sufficient. Also, as in JP 2011-228229 A, that the reflective layer is concaved is large in a load of manufacturing.

The present invention has been made in view of the above problems, and therefore aims at providing an organic EL display device which can improve the light extraction efficiency while suppressing a manufacturing load. The above and other objects and novel features of the present invention will become apparent from the description of the present specification and the attached drawings.

(1) According to the present invention, there is provided an organic EL display device, including: a plurality of organic EL elements each including: an organic light emitting layer; an upper electrode that is formed on an upper side of the organic light emitting layer; and a reflective layer that is formed on a lower side of the organic light emitting layer, in which an image is displayed on a side of the organic light emitting layer on which the upper electrode is formed, in which the reflective layer in each of the organic EL elements includes: a first plane; a second plane that is formed on a side lower than the first plane; and an inclined plane that is formed between the first plane and the second plane, and linearly inclined at a given angle equal to or higher than 35°, and equal to or lower than 55°.

(2) In the organic EL display device according to the item (1), the reflective layer may include a plurality of concave portions formed to be depressed on the basis of the first plane, respective side walls of the plurality of concave portions may be configured by the inclined plane, and respective bottoms of the plurality of concave portions may be configured by the second plane.

(3) In the organic EL display device according to the item (2), the given angle may be equal to or higher than 40° and equal to or lower than 50°.

(4) In the organic EL display device according to the item (2) or (3), an insulating layer may be formed between a lower electrode formed on a lower side of the organic light emitting layer, and the reflective layer, and the insulating layer may be formed to planarize steps generated by the plurality of concave portions.

(5) In the organic EL display device according to the item (2) or (3), the upper electrode and the organic light emitting layer in the organic EL element may be formed to be depressed at positions of the reflective layer where the plurality of concave portions are arranged.

(6) In the organic EL display device according to any one of the items (2) to (5), the second plane formed in the bottom of each of the concave portions, and the first plane formed adjacent to the concave portion may have a width of 1.5 times or higher and 2.5 times or lower of a width of the inclined plane formed between the second plane and the first plane.

(7) The organic EL display device according to any one of the items (1) to (6), may further include: a first substrate on which the plurality of organic EL elements are formed; and a second substrate that seals the plurality of organic EL elements on the first substrate, in which the organic light emitting layer in the plurality of organic EL elements may emit white light, and a color filter may be formed on the second substrate.

(8) The organic EL display device according to any one of the items (1) to (7), may further include: a first substrate on which the plurality of organic EL elements are formed; and a second substrate that seals the plurality of organic EL elements on the first substrate, in which a hollow layer is formed between the first substrate and the second substrate.

According to the present invention, there is provided the organic EL display device which can improve the light extraction efficiency while suppressing a manufacturing load.

DETAILED DESCRIPTION OF THE INVENTION

A description will be given of an organic EL display device according to the respective embodiments of the present invention with reference to the accompanying drawings.

First Embodiment

Figure 1:
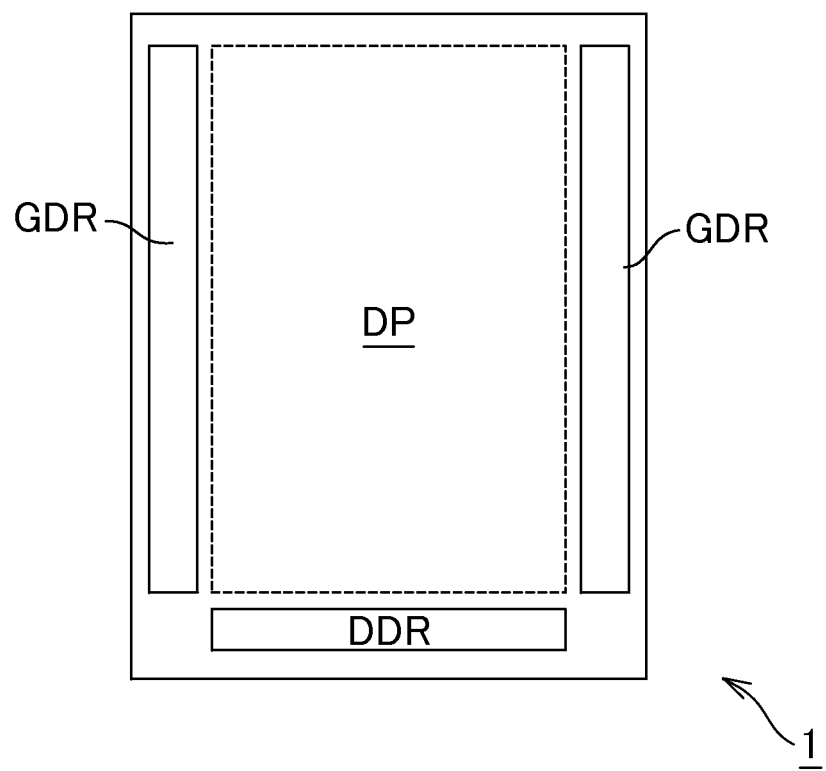
FIG. 1 is a schematic top view of an organic EL display device according to a first embodiment.

FIG. 1 is a top view schematically illustrating an organic EL display device 1 according to a first embodiment of the present invention. The organic EL display device 1 according to this embodiment includes a glass substrate (first substrate) on which plural organic EL elements to be controlled in display are arrayed in a matrix, and a sealing substrate (second substrate) bonded to the glass substrate.

The respective organic EL elements in the organic EL display device 1 are arranged in the pixels within a display area DP in which an image is displayed, and a video signal line driver circuit DDR and a scanning line driver circuit GDR are arranged around the display area DP. Also, each of the organic EL elements includes an upper electrode, a lower electrode, and an organic light emitting layer sandwiched between the upper electrode and the lower electrode as will be described later.

Figure 2:
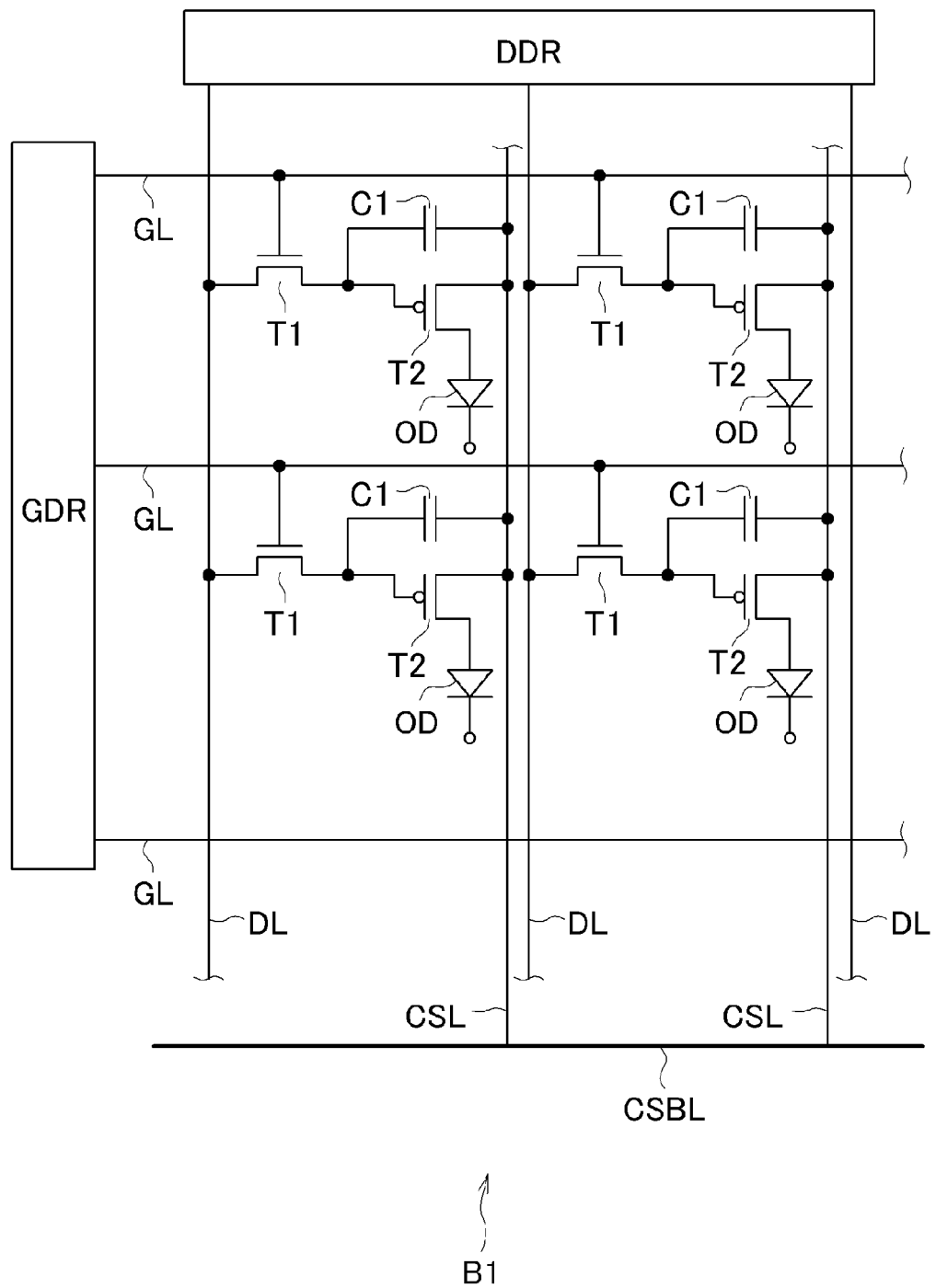
FIG. 2 is a circuit diagram illustrating an example of a circuit disposed on a glass substrate in the organic EL display device according to the first embodiment.

FIG. 2 is a circuit diagram illustrating an example of a circuit disposed on a glass substrate B1 in the organic EL display device. In the glass substrate B1 of FIG. 2, a large number of scanning signal lines GL extend at regular intervals from each other in a horizontal direction of the figure, and a large number of video signal lines DL extend at regular intervals from each other in a vertical direction of the figure. In the glass substrate B1, the respective pixels arrayed into a grid shape are partitioned by the scanning signal lines GL and the video signal lines DL. A thin film transistor T1 used for switching an MIS (metal insulator semiconductor) structure, a thin film transistor T2 used for driving the light emitting element, a storage capacitor C1, and an organic EL element OD are formed. Power supply lines CSL that supply a power supply to the organic EL elements OD extends in parallel to the video signal lines DL in the vertical direction in the figure. Also, the respective scanning signal lines GL and the respective video signal lines DL are connected to the scanning line driver circuit GDR and the video signal line driver circuit DDR, respectively, and the respective power supply lines CSL are connected to a power supply bus line CSBL, and supplied with a current.

Figure 3:
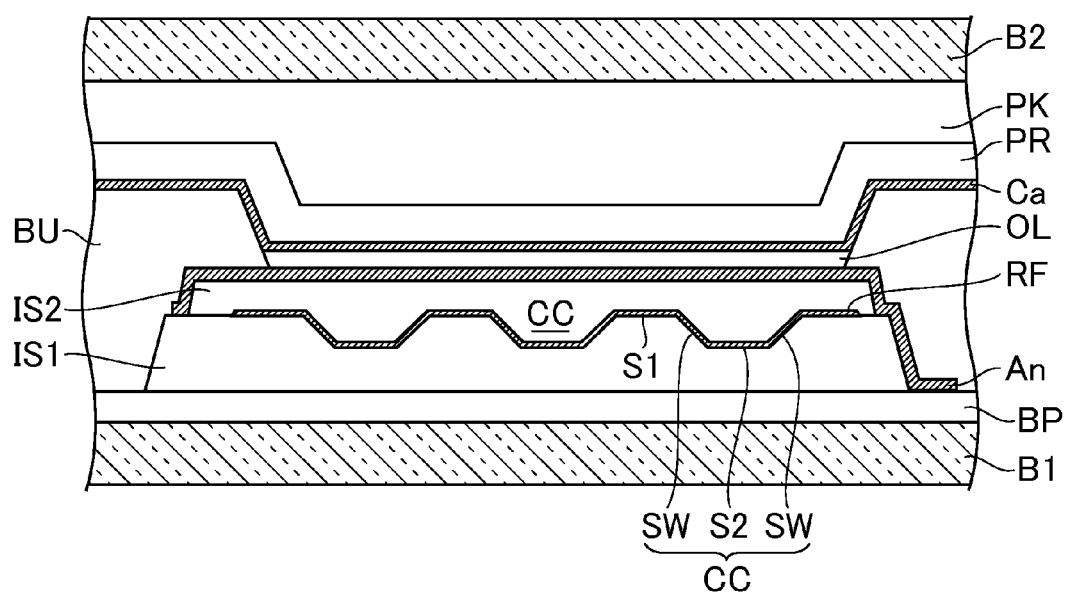
FIG. 3 is a cross-sectional view taken along a given direction within a pixel area in the organic EL display device according to the first embodiment.

Now, particularly, each of the organic EL elements OD and a reflective layer RF provided in the organic EL element OD will be described with reference to FIG. 3. FIG. 3 is a cross-sectional view taken along a given direction within a pixel area. As illustrated in a cross-sectional view of FIG. 3, the inclined planes SW inclined at substantially 45° are formed on the reflective layer RF of this embodiment.

Specifically, the organic EL element OD according to this embodiment includes the organic light emitting layer OL, a lower electrode An, an upper electrode Ca, and the reflective layer RF made of metal high in reflectivity such as aluminum or silver. The reflective layer RF is formed further below the lower electrode An through an insulating layer IS2. Also, an upper side of the upper electrode Ca is covered with a protective layer PR made of silicon nitride (SiN). Further, a resin filler layer PK formed of an organic insulating film is arranged between the protective layer PR and a sealing substrate B2.

The organic light emitting layer OL is formed by laminating a hole transport layer, a light emitting layer, and an electron transport layer in order from a lower side, and emit white color. Also, as the organic light emitting layer OL, plural layers among those layers may be functionally complex, and laminated into two layers or a single layer. Further, layers having other functions such as the hole injection layer or the electron injection layer may be laminated on each other.

Then, the lower electrode An is formed of a transparent conductive film made of an optically transparent indium tin oxide (ITO), and the upper electrode Ca is formed of a transparent conductive film made of indium oxide/zinc oxide (IZO (trademark: indium zinc oxide). The lower electrode An functions as an anode (anode electrode), and is formed for each of the pixel areas, independently, and the upper electrode Ca functions as a cathode (cathode electrode), and is formed over the substantially overall surface of the display area DP as an electrode common to the respective pixel areas.

The lower electrode An is electrically connected to the thin film transistor (not shown in FIG. 3) in a circuit formation layer BP, and is supplied with the signal from the video signal lines DL at timing when the signal is input to the scanning signal lines GL. Also, in the organic light emitting layer OL, the holes injected from the lower electrode An are recombined with the electrons injected from the upper electrode Ca to emit the light, and the light emission of the light emitting layer is controlled according to a potential difference generated between those electrodes.

In particular, the reflective layer RF according to this embodiment has first planes S1 and second planes S2 which are substantially parallel to a substrate surface of a glass substrate G1. The second planes S2 are formed at a side lower than the first planes S1, and the inclined planes SW linearly inclined at a given angle are arranged between the first planes S1 and the second planes S2. The inclined plane SW urges the light from the organic light emitting layer OL which is totally reflected and propagated within the organic EL display device 1 to be emitted, without being totally reflected, to the external of the organic EL display device 1, to thereby improve the ratio of the emitted light to the external. The light emitted from the organic light emitting layer OL which is reflected by the inclined planes SW travel in an upper layer of the insulating layer IS2 as it is, or travel in the upper layer of the insulating layer IS2 through reflection from the second planes S2 or the other inclined planes SW Also, it is preferable that the reflective layer RF has plural concave portions CC as illustrated in FIG. 3. As in FIG. 3, the respective concave portions CC are formed to be depressed in the first planes S1, and the second planes S2 and the inclined planes SW form bottoms and side walls of the concave portions CC. It is preferable that the inclined planes SW are linearly inclined at an angle of 35° or higher or 55° or lower with reference to a substrate plane (or the first planes S1 or the second planes S2) of the glass substrate B1 on which the organic EL elements OD are formed, and it is most preferable that the inclined angle is set to substantially 45°. However, the inclined angle may be set to 40° or higher or 50° or lower, or set to 42° or higher or 48° or lower. The inclined plane SW inclined at an angle of about 45° efficiently promotes the emission of light that is totally reflected and internally propagated to the external, and improves the extraction efficiency as an effective light as compared with the irregularities of the scattering property whose inclined angle is not determined.

Also, it is desirable that spaces between the first planes S1 and the second planes S2 are substantially occupied by the inclined planes SW that are linearly inclined. It is preferable that the first planes S1, the second planes S2, and the inclined plane SW are linearly continuously formed. It is desirable that the inclined plane SW is inclined at a given inclined angle between the boundary of the first plane S1 and the boundary of the second plane S2. Also, in the present specification, "substantially parallel", "substantially 45°", and "substantially occupied" mean that a manufacturing error or a design error is permitted to include those error ranges in addition to a case of being completely parallel, a case of being completely at 45°, and a case of being completely occupied. The inclined angle of the inclined plane SW is measured by, for example, forming a cutting surface by FIB, and processing an image obtained by photographing the cutting surface.

A bank layer BU is formed of an insulating layer formed to separate the plural lower electrodes An formed on the glass substrate B1, the plural organic light emitting layers OL, and the plural reflective layers RF from each other. The bank layer BU in this embodiment forms a pixel separation film formed into a grid shape corresponding to the respective pixel areas, and as illustrated in FIG. 3, and covers the respective ends of the lower electrode An, the reflective layer RF, the insulating layer IS2, and an insulating layer IS1. The organic EL element OD is formed inside of the respective grids in the bank layer BU formed into a grid shape.

The insulating layer IS1 is formed on the circuit formation layer BP as an underlayer of the reflective layer RF, and the insulating layer IS2 is an insulating layer for planarizing the steps between the first planes S1 and the second planes S2 in the reflective layer. As illustrated in FIG. 3, the lower electrode An is formed in contact with an upper surface of the insulating layer IS2, and the light emitted from the organic light emitting layer OL travel in the reflective layer RF through the lower electrode An and the insulating layer IS2.

Also, the insulating layer IS1 is an insulating layer formed as an underlayer of the reflective layer RF, and the concave portions CC are formed by irregularities of the insulating layer IS1. Irregularities may be formed in the insulating layer IS1 by exposing portions in which the concave portions CC are formed, for example, with the use of a photosensitive acrylic, or the insulating layer IS1 may be formed of inorganic insulating film, and the concave portions CC may be formed by etching. Also, as the concave portions CC, as described above, a process may be controlled so that the inclined planes SW are linearly inclined at a tapered angle of 35° or higher, and 55° or lower, and it is preferable that the inclined angle of the side surfaces SW is set to 45°.

Also, according to this embodiment, the sealing substrate B2 has a color filter not shown, as a result of which the organic light emitting layer OL that emits white light is colored. The protective layer PR made of silicon nitride and a resin filler layer PK made of an organic insulating film are arranged between the sealing substrate B2 and the upper electrode Ca, as a result of which the organic light emitting layer OL is protected from moisture.

Subsequently, an optical path that travels within the layer structure from the reflective layer RF to the sealing substrate B2 will be described with reference to FIG. 4.

Figure 4:
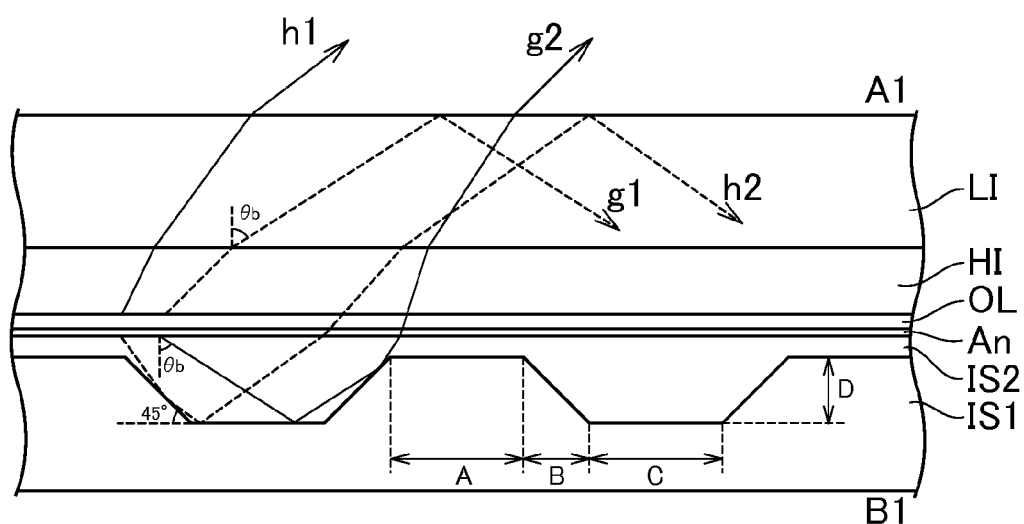
FIG. 4 is a diagram illustrating an outline of an optical path along which light travels within a layer structure from a reflective layer to a sealing substrate, in the organic EL display device according to the first embodiment.
Figure 8:
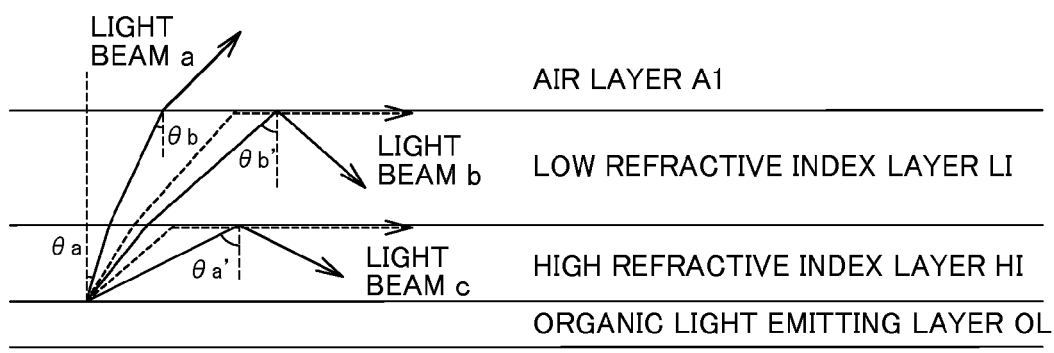
FIG. 8 is a diagram illustrating an example of an optical path of light emitted to an observer side of an organic EL display device, and an optical path of light repetitively totally reflected within the organic EL display device.

Referring to FIG. 4, as in FIG. 8, the upper electrode Ca and the protective layer PR are simplified as the high refractive index layer HI, and the resin filler layer PK and the sealing substrate B2 are simplified as the low refractive index layer LI for illustration. Also, a refractive index in the high refractive index layer HI or the lower electrode An is set as 1.85, and a refractive index in the low refractive index layer LI, the organic light emitting layer OL, or the insulating layer IS2 is set as 1.5. However, the reflective layer RF formed on the surface of the insulating layer IS2 is omitted from the illustration. Also, in FIG. 4, an optical path g1 and an optical path g2, as well as an optical path h1 and an optical path h2, which travel in symmetrical directions on the basis of the organic light emitting layer OL are illustrated as a typical example. In a pair of light beams, the emission angle to the high refractive index layer HI, and the emission angle to the lower electrode An become symmetrical angle, and the emission angle from the high refractive index layer HI to the low refractive index layer LI, and the emission angle from the lower electrode An to the insulating layer IS2 are symmetrical angle.

First, in the optical path g1, the light is totally reflected in the interface between the low refractive index layer LI and the air layer A1, and not emitted to the external of the organic EL display device 1. On the contrary, in the optical path g2, the light is emitted from the organic light emitting layer OL toward the reflective layer RF side. When the reflective layer RF has no concave portions CC, and is flatly formed over the overall area of one pixel, in the optical path g2, as in the optical path g1, the light is totally reflected by the interface of the air layer A1, and not emitted to the external. However, the light is reflected by the bottom and the side wall in the concave portion CC, and extracted to the external.

Specifically, if the emission angle (incident angle to the interface of the air layer A1) to the low refractive index layer LI in the optical path g1 is θb, the emission angle to the insulating layer IS2 from the lower electrode An in the optical path g2 is also θb, the incident angle θc (not shown in FIG. 4) to the lower electrode An after the light has been reflected by the inclined plane SW inclined at 45° with respect to the second planes S2 is 90°-θb. Also, taking the optical path g1 in which the light is totally reflected in the air layer A1 into account, since θb becomes 41.8° or higher, the light in the optical path g2 which travels in the low refractive index layer L1 is in a range of 0°≤c≤48.2°, and a light in a range of 0°≤c≤41.8° within the above range is extracted to the external without being totally reflected.

That is, as in the optical paths g1 and g2, the light when the emission angle θb to the low refractive index layer LI or the insulating layer IS2 is 41.8° or higher and 90° or lower is totally reflected by the interface of the air layer A1, and hardly extracted to the external if the reflective layer RF is flat over the overall pixel area. However, when the reflective layer RF is formed with the concave portions CC, the travel direction is changed so that the light enters the interface of the air layer A1 in a range of 0° or higher and 48.2° or lower, and the light in a range of 0° or higher and 41.8° or lower which occupies a relatively large ratio of the above range is extracted to the external.

Then, the optical path h1 travel in the upper side of the organic light emitting layer OL, and becomes an effective light that is emitted to the external from the interface with the air layer A1. The optical path h2 travel in the reflective layer RF side on the basis of the organic light emitting layer OL. If the reflective layer RF becomes flat in the overall pixel area, the light of the optical path h2 is in a range (0°≤θb≤41.8°) of the incident angle θb which becomes the effective light, but the light is reflected by the second planes S2 or the inclined planes SW, and travels in the insulating layer IS2 at an angle of 48.2° or higher, and 90° or lower, and enters the lower electrode An. As a result, the light becomes an ineffective light. However, the light of the optical path h2 is repetitively reflected within the layer structure, and again reflected by the inclined plane SW, and can be extracted as the effective light (the same is applied to the optical path g1).

In view of the above, in the organic EL display device 1 according to this embodiment, the amount of effective light can be increased by the second planes S2 formed at the side lower than the first planes S1 in the reflective layer RF, and the inclined plane SW inclined at 45° formed between the first planes S1 and the second planes S2.

Figure 5A:
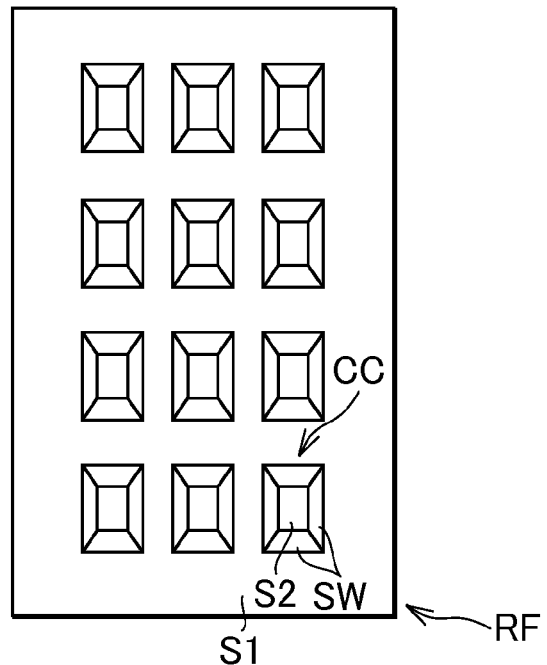
FIG. 5A is a diagram illustrating a planar configuration of a reflective layer according to the first embodiment.
Figure 5B:
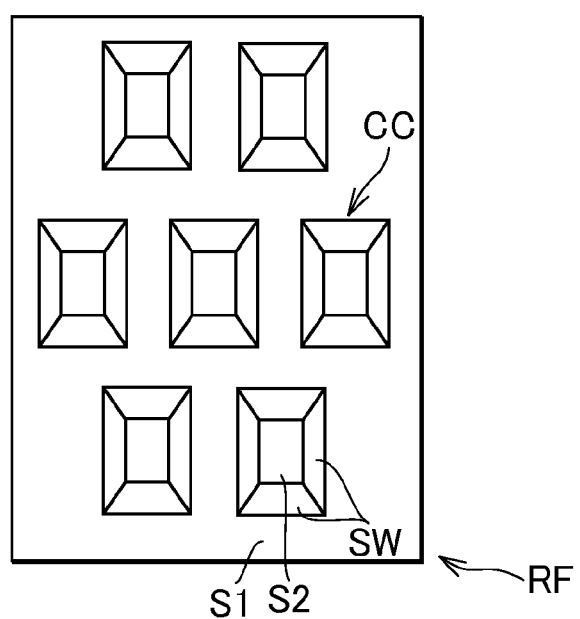
FIG. 5B is a diagram illustrating another example of the planar configuration of the reflective layer according to the first embodiment.

FIG. 5A is a diagram illustrating a planar configuration of the reflective layer RF according to this embodiment, in which 12 concave portions CC are formed in the reflective layer RF within one pixel having a size of about 30×40 microns. As the layout of the concave portions CC, as illustrated in FIG. 5A, the concave portions CC may be arrayed at given intervals along the partitions (directions parallel to directions of extending the scanning signal lines GL and the video signal lines DL) of the pixel area in the vertical and horizontal directions. Alternatively, as illustrated in FIG. 5B, the concave portions CC may be staggered. Also, as illustrated in FIG. 5A, it is preferable that the inclined planes SW are formed in a planar shape.

Also, it is desirable that as the dimensions of the concave portions CC in the reflective layer RF, a dimension A which is a width of the first plane S1 in FIG. 4, and a dimension C which is a width of the second plane S2 are set to 1.5 times or higher and 2.5 times or lower of dimensions B or D which are the width or the height of the inclined plane SW, and preferably set to 1.8 times or higher and 2.2 times or lower. The dimensions A to D in FIG. 4 are lengths defined in a cross-section passing through centers of the two concave portions CC adjacent to each other among the plural concave portions CC. When A:B:C:D is set to 2:1:2:1, the amount of effective light is about 1.5 times as compared with a case where the reflective layer RF is flatly formed, which is preferable.

Modification 1

Subsequently, a modification 1 of this embodiment will be described. In the above first embodiment, a space between the sealing substrate B2 and the protective layer PR is filled with the resin filler layer PK. On the other hand, in the modification 1, a hollow layer filled with gas instead of the resin filler layer PK is arranged.

When the hollow layer lower in the refractive index than the resin filler layer PK is arranged, a part of the light emitted from the organic light emitting layer OL is totally reflected by an interface between the hollow layer and the protective layer PR, and travels into the layer structure. Since the optical paths g1 and h1 in FIG. 4 of the first embodiment are totally reflected by the interface with the air layer A1, light may be emitted to the external from a pixel area far away from another pixel having the organic light emitting layer OL from which the light emits. However, in the modification 1, when the resin filler layer PK is replaced with the hollow layer, the spread of the light from the organic light emitting layer OL that emits the light is suppressed, and totally reflected on the reflective layer RF side. As a result, the problems caused by false display becomes difficult to occur.

Second Embodiment

Figure 6:
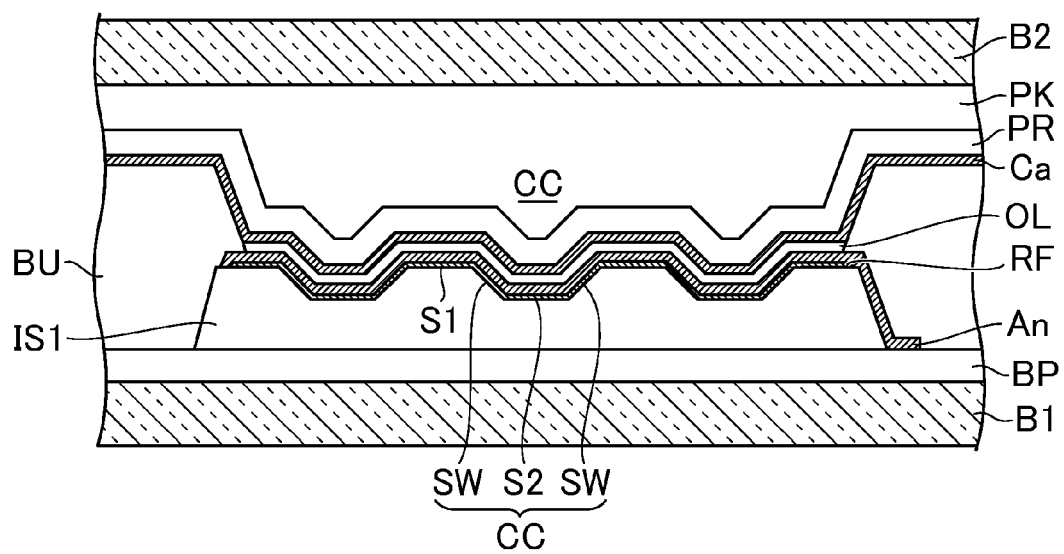
FIG. 6 is a cross-sectional view taken along a given direction within a pixel area in the organic EL display device according to a second embodiment.

Subsequently, a description will be given of an organic EL display device 1 according to a second embodiment of the present invention. In the organic EL display device 1 according to the above first embodiment, the insulating layer IS2 is arranged between the reflective layer RF and the lower electrode An to planarize the organic light emitting layer OL. On the other hand, as illustrated in FIG. 6, the plural concave portions CC of the reflective layer RF are not planarized, and therefore, the irregularities are formed in the lower electrode An, the organic light emitting layer OL, the upper electrode Ca, and the protective layer PR in correspondence with the plural concave portions CC.

Figure 7:
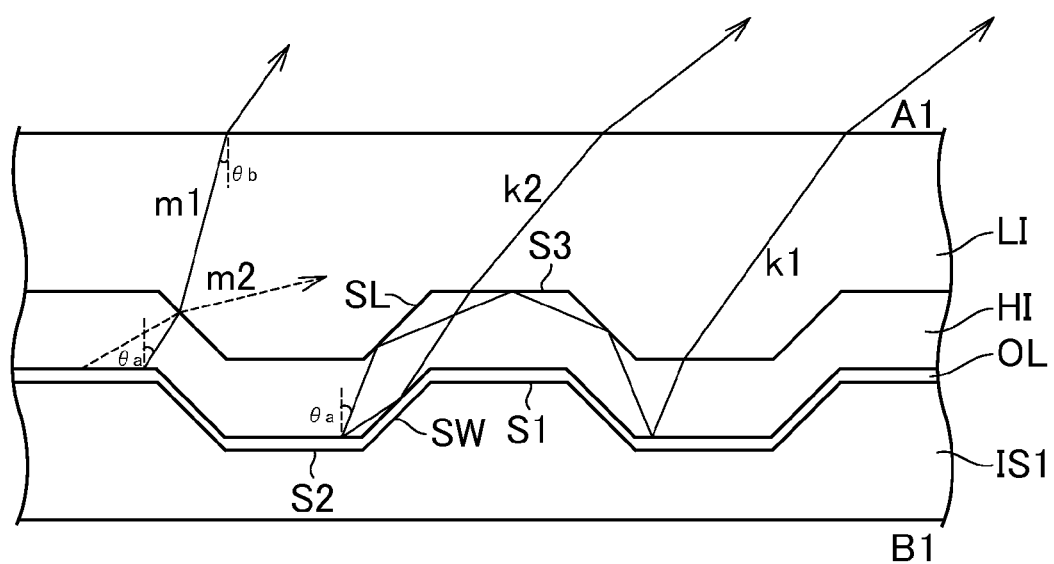
FIG. 7 is a diagram illustrating an outline of an optical path along which light travels within a layer structure from a reflective layer to a sealing substrate, in the organic EL display device according to the second embodiment.

FIG. 7 is a diagram illustrating an outline of an optical path along which light travels within a layer structure from the reflective layer RF to the sealing substrate B2, in the organic EL display device 1 according to the second embodiment. Hereinafter, a typical example of the optical path that internally travels will be described with reference to FIG. 7.

In FIG. 7, as in the case of FIG. 4, the upper electrode Ca and the protective layer PR are indicated as the high refractive index layer HI, and the resin filler layer PK and the sealing substrate B2 are indicated as the low refractive index layer LI. Also, a refractive index in the high refractive index layer HI or the lower electrode An is set as 1.85, and a refractive index in the low refractive index layer LI, or the organic light emitting layer OL is set as 1.5. Also, the light that is emitted from the upper surface of the organic light emitting layer OL, and the light emitted by the lower surface of the organic light emitting layer OL, and reflected by the reflective layer RF are treated by approximation as the substantially same light, and notations of the lower electrode An and the reflective layer RF will be appropriately omitted.

In this example, optical paths k1 and k2 indicate the light emitted from the second planes S2, and optical paths m1 and m2 indicate the light emitted from the first planes S1. In the following description, light emitted from the second planes S2, and entering an interface (diagonal formation interface SL) diagonally formed between the high refractive index layer HI and the low refractive index layer LI will be first described.

The emission angle $\theta a$ from the second plane S2 satisfies $0°<\theta a<9.2°$, an incident angle to the diagonal formation interface SL becomes a critical angle (54.2°) or lower, and the light is emitted to the low refractive index layer LI. Then, the emission angle $\theta a$ satisfies $0°<\theta a<9.2°$, the emission angle $\theta p$ to the low refractive index layer LI with reference to the diagonal formation interface SL becomes $\theta p=\arcsin(1.85/1.5\times\sin(\theta a))$, and the incident angle $\theta q$ of the light to the interface with the air layer A1 becomes $\theta q=45°-\theta p$ ($\theta p$ and $\theta q$ are not shown in FIG. 7). Therefore, since the critical angle in the interface with the air layer A1 is 41.8°, the emission angle $\theta a$ from the organic light emitting layer OL satisfies $0°<\theta a\leq2.7°$, the light is totally reflected by the interface with the air layer A1, and the light is emitted from the air layer A1 when $2.7°<\theta a<9.2°$ is satisfied.

Subsequently, a case in which the emission angle $\theta a$ from the second plane S2 satisfies $9.2°\leq\theta a<45°$ will be described. As indicated by the optical path k1 in FIG. 7, since the light that satisfies $9.2°\leq\theta a<45°$ is input to the diagonal formation interface SL at an angle larger than the critical angle (54.2°), the light is totally reflected toward upper interfaces S3 where the high refractive index layer HI and the low refractive index layer LI are flatly formed. Then, if the emission angle $\theta a$ from the second planes S2 satisfies $9.2°\leq\theta a\leq35.8°$ within the above range, the light is totally reflected by the upper interface S3 as indicated by the optical path k1. If the emission angle $\theta a$ from the second planes S2 satisfies $35.8°\leq\theta a\leq45°$, the light travels from the upper interface S3 to the low refractive index layer LI, and is totally reflected by the air layer A1. Further, the light totally reflected by the upper interface S3 as indicated by the optical path k1 is emitted to the external as the effective light through the reflection by the diagonal formation interface SL and the second plane S2 which face each other.

Then, if the emission angle $\theta a$ from the second plane S2 satisfies $45°<\theta a<90°$, the light is reflected upward by the side surface SW, as indicated by the optical path k2 in FIG. 7. If the emission angle $\theta a$ from the second plane S2 satisfies $45°<\theta a\leq54.2°$, the light is totally reflected by the interface with the air layer A1 after passing through the upper interface S3. However, if the emission angle $\theta a$ from the second plane S2 satisfies $54.2°<\theta a<90°$ as indicated by the optical path k2, the light is emitted to the external of the upper interface S as the effective light.

Then, the light emitted from the first plane S1 and entering the diagonal formation interface SL will be described.

If the light is emitted from the first plane S1 at an angle of $0°\leq\theta a\leq45°$, and enters the diagonal formation interface SL, the angle $\theta b$ (angle incident on the interface of the air layer A1) at which the light travels in the low refractive index layer LI satisfies $14.7°\leq\theta b\leq45°$, and the light becomes the effective light at the angle of $14.7°\leq\theta b\leq41.8°$ within that range (therefore, due to the presence of the inclined plane SW, the light in a range of 32.7° or higher and 42.4° or lower newly becomes the effective light). Specifically, the light of the optical path m1 travels within the low refractive index layer LI at the angle of $14.7°\leq\theta b\leq41.8°$, and as illustrated in FIG. 7, the light emitted to the external (corresponding to the light emitted to the high refractive index layer HI at the angle of $0°\leq\theta a\leq42.4°$).

Also, in the optical path m2, the light is emitted from the first planes S1 at the emission angle of $45°<\theta a<90°$, and enters the diagonal formation interface SL. The optical path m2 enters the low refractive index layer LI from the diagonal formation interface SL, travels within the low refractive index layer LI at the angle of $45°<\theta b<105.7°$, and is totally reflected by the interface of the air layer A1 (becomes ineffective light).

As has been described above, in the organic EL display device 1 according to the second embodiment, the emission of light to the external is facilitated by the concave portions CC, and the ratio of the effective light to the light that enters the diagonal formation interface SL from the first planes S1 and the second planes S2 increases. Also, even if the light is totally reflected by the interface with the air layer A1 into the ineffective light, the light is again reflected by the concave portions CC of the reflective layer RF, and can be extracted as the effective light.

In the above respective embodiments, the plural concave portions having the inclined plane inclined at the given angle are formed in the reflective layer RF. Alternatively, with the formation of convex portions, the first planes S1, the second planes S2, and the inclined planes inclined at the given angle may be formed.

In the second embodiment, the lower electrode An and the reflective layer RF are formed. Alternatively, the reflective layer RF may serve also as the lower electrode An. Also, in the above respective embodiments, it is desirable that the upper electrode Ca is formed with the reflectivity as small as possible (it is desirable that the upper electrode Ca does not function as a half mirror).

It is desirable that an inclined plane SW is formed into a planar shape as in the above respective embodiments. Alternatively, for example, the inclined plane SW may be shaped into an inverted truncated cone whose concave portion CC is inclined at an angle of 45°, and may be formed into any shape if the inclined plane SW is linearly inclined.

In the above respective embodiments, the organic light emitting layer OL of the respective organic EL elements emit the light of white, and the light is colored with a color filter. Alternatively, for example, the organic light emitting layers OL of the different light emission colors may be arranged in the respective pixels.

The present invention is not limited to the above embodiments, but can be variously modified. For example, the configuration described in the embodiments can be replaced with the substantially identical configuration, a configuration having the identical operational effects, or a configuration that can achieve the same purpose.

While there have been described what are at present considered to be certain embodiments of the invention, it will be understood that various modifications may be made thereto, and it is intended that the appended claims cover all such modifications as fall within the true spirit and scope of the invention.

What is claimed is:
1. An organic EL display device, comprising:
   a plurality of organic EL elements each including:
   an organic light emitting layer;
   an upper electrode that is formed on an upper side of the organic light emitting layer over which an image is displayed; and a reflective layer that is formed on a lower side of the organic light emitting layer;
a first substrate on which the plurality of organic EL elements are formed; and
a second substrate that seals the plurality of organic EL elements on the first substrate,
wherein
the reflective layer in each of the organic EL elements includes:
a first plane;
a second plane that is formed on a side lower than the first plane; and
an inclined plane that is formed between the first plane and the second plane, and linearly inclined at a given angle equal to or higher than 35°, and equal to or lower than 55°,
the reflective layer includes a plurality of concave portions formed to be depressed on the basis of the first plane,
respective side walls of the plurality of concave portions are configured by the inclined plane,
respective bottoms of the plurality of concave portions are configured by the second plane, and
a hollow layer is formed between the first substrate and the second substrate.

2. The organic EL display device according to claim 1, wherein the given angle is equal to or higher than 40° and equal to or lower than 50°.

3. The organic EL display device according to claim 1, wherein an insulating layer is formed between a lower electrode formed on a lower side of the organic light emitting layer, and the reflective layer, and
wherein the insulating layer is formed to planarize steps generated by the plurality of concave portions.

4. The organic EL display device according to claim 1, wherein the upper electrode and the organic light emitting layer in the organic EL element are formed to be depressed at positions of the reflective layer where the plurality of concave portions are arranged.

5. The organic EL display device according to claim 1, wherein the second plane formed in the bottom of each of the concave portions, and the first plane formed adjacent to the concave portion have a width of 1.5 times or higher and 2.5 times or lower of a width of the inclined plane formed between the second plane and the first plane.

6. An organic EL display device, comprising:
a plurality of organic EL elements each including:
an organic light emitting layer configured to emit white light;
an upper electrode that is formed on an upper side of the organic light emitting layer over which an image is displayed; and
a reflective layer that is formed on a lower side of the organic light emitting layer;
a first substrate on which the plurality of organic EL elements are formed;
a second substrate that seals the plurality of organic EL elements on the first substrate; and
a color filter on the second substrate,
wherein
the reflective layer in each of the organic EL elements includes:
a first plane;
a second plane that is formed on a side lower than the first plane; and
an inclined plane that is formed between the first plane and the second plane, and linearly inclined at a given angle equal to or higher than 35°, and equal to or lower than 55°,
the reflective layer includes a plurality of concave portions formed to be depressed on the basis of the first plane,
respective side walls of the plurality of concave portions are configured by the inclined plane, and
respective bottoms of the plurality of concave portions are configured by the second plane.

7. The organic EL display device according to claim 6, wherein the given angle is equal to or higher than 40° and equal to or lower than 50°.

8. The organic EL display device according to claim 6, wherein an insulating layer is formed between a lower electrode formed on a lower side of the organic light emitting layer, and the reflective layer, and
wherein the insulating layer is formed to planarize steps generated by the plurality of concave portions.

9. The organic EL display device according to claim 6, wherein the upper electrode and the organic light emitting layer in the organic EL element are formed to be depressed at positions of the reflective layer where the plurality of concave portions are arranged.

10. The organic EL display device according to claim 6, wherein the second plane formed in the bottom of each of the concave portions, and the first plane formed adjacent to the concave portion have a width of 1.5 times or higher and 2.5 times or lower of a width of the inclined plane formed between the second plane and the first plane.

11. An organic EL display device, comprising:
a plurality of organic EL elements each including:
an organic light emitting layer;
an upper electrode that is formed on an upper side of the organic light emitting layer over which an image is displayed; and
a reflective layer that is formed on a lower side of the organic light emitting layer;
wherein
the reflective layer in each of the organic EL elements includes:
a first plane;
a second plane that is formed on a side lower than the first plane; and
an inclined plane that is formed between the first plane and the second plane, and linearly inclined at a given angle equal to or higher than 35°, and equal to or lower than 55°,
the reflective layer includes a plurality of concave portions formed to be depressed on the basis of the first plane,
respective side walls of the plurality of concave portions are configured by the inclined plane,
respective bottoms of the plurality of concave portions are configured by the second plane, and,
the second plane formed in the bottom of each of the concave portions, and the first plane formed adjacent to the concave portion have a width of 1.5 times or higher and 2.5 times or lower of a width of the inclined plane formed between the second plane and the first plane.

* * * * *